United States Patent [19]
Ping

[11] Patent Number: 5,616,519
[45] Date of Patent: Apr. 1, 1997

[54] NON-ETCH BACK SOG PROCESS FOR HOT ALUMINUM METALLIZATIONS

[75] Inventor: Teong S. Ping, Singapore, Singapore

[73] Assignee: Chartered Semiconductor Manufacturing Pte Ltd., Singapore, Singapore

[21] Appl. No.: 552,244

[22] Filed: Nov. 2, 1995

[51] Int. Cl.$^6$ .............................. H01L 21/44; H01L 21/48
[52] U.S. Cl. .................... 438/626; 216/41; 438/624; 438/627; 438/633; 438/636; 438/637
[58] Field of Search .................... 437/195, 190, 437/192, 194, 228, 231, 229, 927, 978; 216/41, 42

[56] References Cited

U.S. PATENT DOCUMENTS

| | | | |
|---|---|---|---|
| 4,353,159 | 10/1982 | Hsu | 437/195 |
| 4,917,759 | 4/1990 | Fisher et al. | 156/643 |
| 5,158,910 | 10/1992 | Cooper et al. | 437/195 |
| 5,283,208 | 2/1994 | Lorsung et al. | 437/195 |
| 5,312,512 | 5/1994 | Allman et al. | 437/228 |
| 5,354,713 | 10/1994 | Kim et al. | 437/195 |
| 5,518,963 | 5/1996 | Park | 437/195 |

*Primary Examiner*—Charles L. Bowers, Jr.
*Assistant Examiner*—Lynne A. Gurley
*Attorney, Agent, or Firm*—George O. Saile

[57] ABSTRACT

A process has been developed in which planar, multilevel metallizations, are used to fabricate semiconductor devices. The process features initially forming tall, narrow photoresist plugs, and filling the spaces between photoresist plugs with a planarizing layer of a composite dielectric, which includes a spin on glass layer. Removal of the photoresist plug results in the creation of a narrow via hole. The composite dielectric was deposited by initially using a non-porous, silicon oxide layer, followed by the planarizing spin on glass layer. Therefore metal via fills will interface the non-porous, silicon oxide layer.

25 Claims, 5 Drawing Sheets

NON-ETCH BACK SOG PROCESS FOR HOT ALUMINUM METALLIZATIONS

BACKGROUND OF THE INVENTION

1. Field of the Invention

This present invention relates to the fabrication methods used to produce semiconductor devices, and more specifically to methods used for planarizing devices using spin on glass, (SOG), chemical mechanical polishing, (CMP), and hot deposition of aluminum alloy metallization.

2. Description of Prior Art

A major objective of the semiconductor industry has been to continually improve device performance while still maintaining, or decreasing, the manufacturing cost of the specific semiconductor chip. This objective has been, in part, realized by the trend to micro-miniaturazation. The ability to fabricate semiconductor devices with sub-micron features, has allowed both the performance and cost objectives to be met. Smaller features positively influence performance by decreasing parasitic capacitances, as well as decreasing specific performance degrading resistances. In addition micro-miniaturazation has resulted in a decrease in chip size, thus enabling more chips to be placed on a specific size, starting silicon substrate, thus reducing the processing cost for a specific chip.

Micro-miniaturization has been accomplished by advances in several key semiconductor fabrication disciplines such as photolithography and reactive ion etching, (RIE). For example more sophisticated exposure cameras, as well as the development of more sensitive photoresist materials, have allowed sub-micron images to be routinely created in photoresist materials. In addition similar advances in anisotropic, dry etching processes, have allowed the sub-micron images in photoresist to be successfully transferred to underlying semiconductor materials. However smaller features, such as narrower metal interconnect lines, along with smaller spaces between interconnect lines, can result in difficulties in obtaining planar surfaces, which are needed to create successful subsequent upper level wiring lines. In addition to maintain the desired conductivity of the narrower metal lines, the height of the metal line has to be increased. This results in a higher aspect ratio than for counterparts fabricated with wider, thinner metal lines, again adding to the difficulties in filling the narrow spaces with insulator.

One method used by the semiconductor industry to fill narrow spaces, between metal lines, is a spin on glass, (SOG), process. Unlike more conventional insulator deposition processes, such as low pressure chemical vapor deposition, (LPCVD), or plasma enhanced chemical vapor deposition, (PECVD), where conformal coverage of the metal line with the deposited insulator still leaves a severe topography for subsequent wiring processes, the SOG process fills these narrow spaces, and after applying subsequent planarazation techniques, results a planar topography. Prior art has shown SOG applications, such as Kim, et al, in U.S. Pat. No. 5,354,713, as well as Fisher, et al, in U.S. Pat. No. 4,917,759. However these applications, although resulting in the desired planarity, also result in the SOG layer being exposed during subsequent metal depositions. The characteristics of the SOG layer include outgassing of incorporated oxygen or moisture during a hot metal deposition process. This outgassing can result in degraded aluminum metal properties, such as increased resistivity, due to the reaction with the SOG outgassing components.

This invention will describe a process for achieving planar topographies, using a SOG process to fill narrow spaces between metal lines. However this invention will show SOG planarization processes, and encapsulation techniques, used to prevent SOG outgassing during subsequent hot aluminum depositions.

SUMMARY OF THE INVENTION

It is object of this invention to use an organic photoresist plug for creation of a desired via hole shape in an insulator composite.

It is another object of this invention to use a SOG layer, as part of the insulator composite, for purposes of supplying a planar topography.

It is still another object of this invention to encapsulate most of the exposed SOG surface with a less porous dielectric layer, while encapsulating the remaining SOG surface with a barrier, metal layer, prior to deposition of aluminum.

In accordance with the present invention a method is described for fabricating semiconductor devices, exhibiting planar metallization and insulation levels, via the use of insulator composites, featuring SOG layers. A first metallization pattern, contacting underlying silicon device elements, is coated with an organic, photo-sensitive material. Photolithographic patterning is performed to create organic plug shapes on the first metallization pattern. A thin interlevel metal dielectric is deposited, conformally covering the organic plugs. A spin on glass, (SOG), layer is next deposited on the thin interlevel metal dielectric, for purposes of filling the spaces between organic plugs, thus creating a smoother topography. The structure, including the SOG layer, is next subjected to a bake out and curing process, for purposes of densifying the SOG layer. Another insulator layer is deposited on the cured SOG layer followed by chemical mechanical polishing to completely planarize the structure, stopping at a point where the top of the organic plugs are exposed. The organic plugs are then removed, resulting in a via hole, in the composite dielectric, to the first metallization layer. A thin contact and barrier layer is next deposited, followed by deposition aluminum. photolithographic and dry etching procedures are then employed to pattern the aluminum—barrier layers—creating the second metallization pattern.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of forming a planar topography, using a SOG layer to fill the spaces between metal vias, will be covered in detail. This process can be used for the fabrication of metal oxide semiconductor field effect transistors, (MOSFET), devices that are currently being manufactured in industry, therefore only the specific areas unique to understanding this invention will be described in detail.

Figure 1:
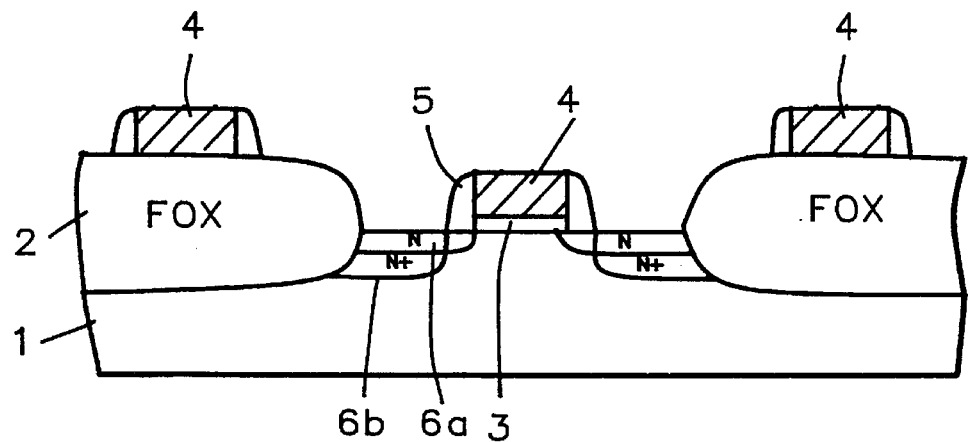
FIGS. 1–2, which schematically in cross-sectional style show the stages of fabrication prior to forming the organic plug.

FIG. 1, shows a typical, N channel, (NFET), device, where a process exhibiting a planar topography, via use of a SOG layer, will be used to fabricate reliable interconnect metallizations. A substrate, 1, composed of P type, single crystalline silicon, with a <100> orientation, is used. A thick field oxide, 2, (FOX), is formed surrounding the region where the device will be built. Briefly the method used to produce the FOX insulator is to create an oxidation mask of an overlying $Si_3N_4$ layer, and an underlying $SiO_2$ layer. Conventional photolithographic and RIE processes are used to create the mask shape. After photoresist removal, and careful wet cleans, the FOX region is created in the unmasked, non-device regions, via a thermal oxidation in an oxygen—steam ambient, at a temperature between about 800° to 1000° C., to achieve FOX thickness between about 4000 to 7000 Angstroms. After removal of the oxidation masking layers, hot phosphoric acid for the $Si_3N_4$ layer and a buffered hydrofluoric acid solution for the underlying $SiO_2$ layer, a thin $SiO_2$, gate insulator, 3, is grown in an oxygen—steam ambient, at a temperature between about 800° to 1000° C., to a thickness between about 65 to 300 Angstroms. A layer of polysilicon is than deposited, using LPCVD processing, at a temperature between about 500° to 700° C., to a thickness between about 1500 to 4000 Angstroms. The polysilicon is than doped via an ion implantation of phosphorous, at an energy between about 25 to 100 Kev., at a dose between about 1E14 to 1E16 atoms/cm². Another alternative is to use a polycide gate structure, consisting of a tungsten silicide layer, chemically vapor deposited to a thickness between about 1500 to 2500 Angstroms, and capped with a chemically vapor deposited polysilicon layer, at a thickness between about 500 to 1000 Angstroms. However for this invention the polysilicon gate structure will be used. Photolithographic and anisotropic RIE processes, using $Cl_2$ as an etchant, are used to create polysilicon gate structures, 4, shown in FIG. 1. After photoresist removal, using plasma oxygen ashing, and careful wet cleans, a blanket ion implantation is performed, using phosphorous or arsenic, at an energy between about 30 to 100 Kev., at a dose between about 1E12 to 1E13 atoms/cm², is used to create lightly doped source and drain regions, 6a. Next sidewall spacer, 5, is created. The spacer is obtained by initially depositing a layer of silicon oxide, via either PECVD or LPCVD processing, at a temperature between about 400° to 925° C., to a thickness between about 1000 to 4000 Angstroms, followed by an anisotropic RIE procedure, using for example a spices like $CHF_3$ as an etchant. A blanket ion implantation step is again performed, using arsenic, at an energy between about 30 to 100 Kev., at a dose between about 1E13 to 1E16 atoms/cm², is used to create source and drain regions, 6b, shown schematically in FIG. 1.

Figure 2:
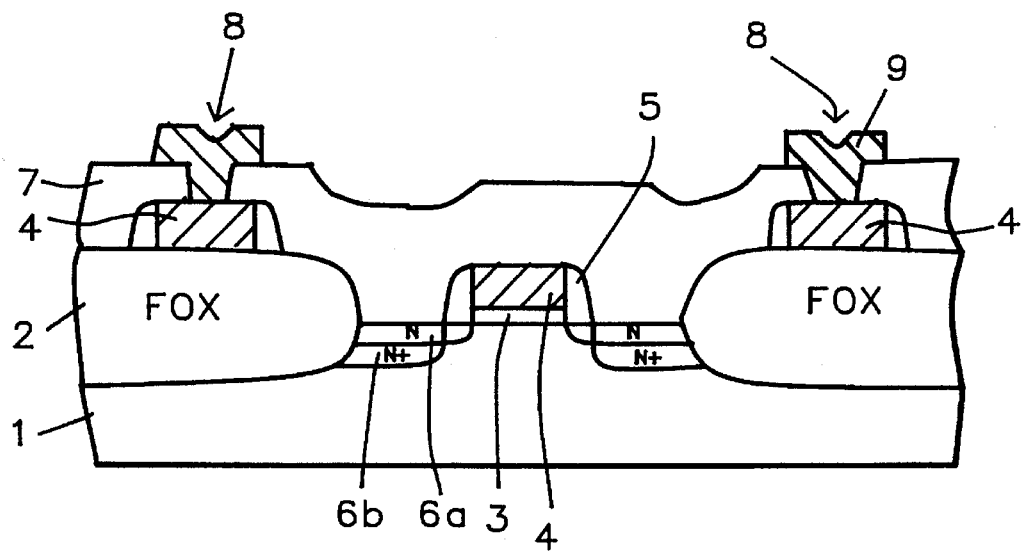

Another composite layer of undoped, or doped silicon oxide, 7, is deposited using PECVD, LPCVD, or atmospheric pressure chemical vapor deposition, (APCVD), processing, at a temperature between about 400° to 700° C., to a thickness between about 5000 to 10000 Angstroms. A first via hole, 8, is opened in composite silicon oxide layer, 7, to expose the surface of polysilicon gate structure, 4, or the surface of the source and drain region, 6b, using standard photolithographic and RIE procedures. For this invention the via hole, 8, will be shown opened to only to polysilicon gate structure, 4. The selective, RIE procedure was performed using $CHF_3$ as an etchant. After photoresist removal, accomplished by using a plasma oxygen ashing process, followed by careful wet cleans, a first level metallization is performed. The first level metallization may be composed of a barrier layer of titanium nitride, followed by an r.f. deposited layer of an aluminum—copper alloy. The aluminum—copper alloy is deposited using r.f. sputtering, to a thickness between about 6000 to 10000 Angstroms. Again conventional photolithographic and RIE processing, using for example a $Cl_2$ etchant, are employed to create first level metal structure, 9, shown in FIG. 2. Plasma oxygen ashing, followed by careful wet cleans, are again used to remove the photoresist image used to define first level metal structure, 9.

Figure 3:
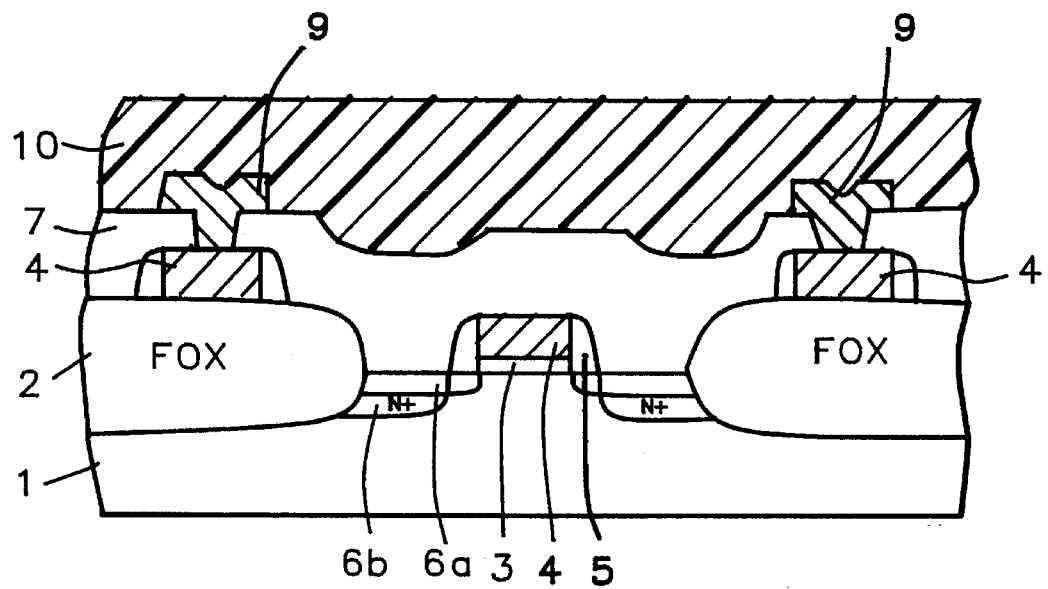
FIGS. 3–4, which schematically, in cross-sectional style, show the stages of formation of the organic plug.
Figure 4:
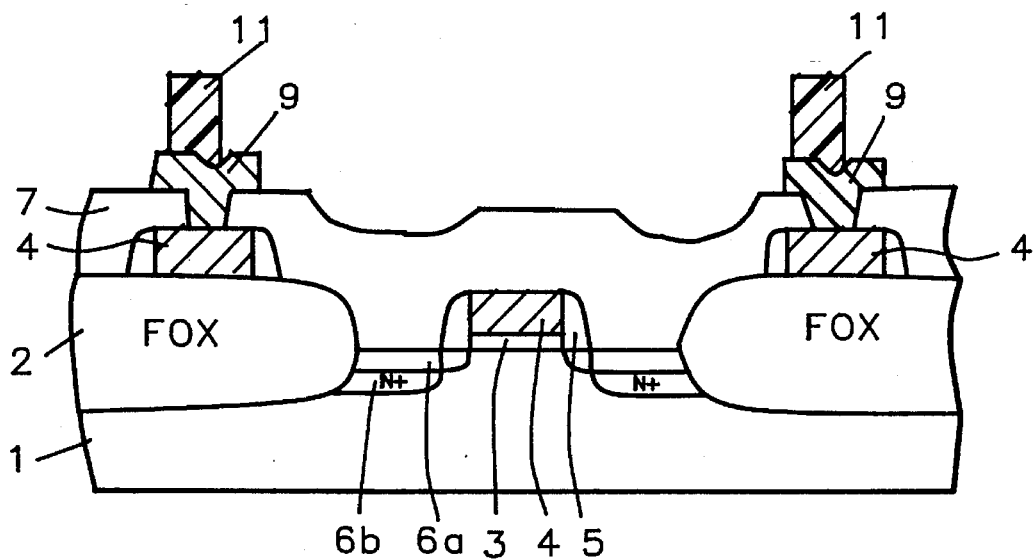
Figure 5:
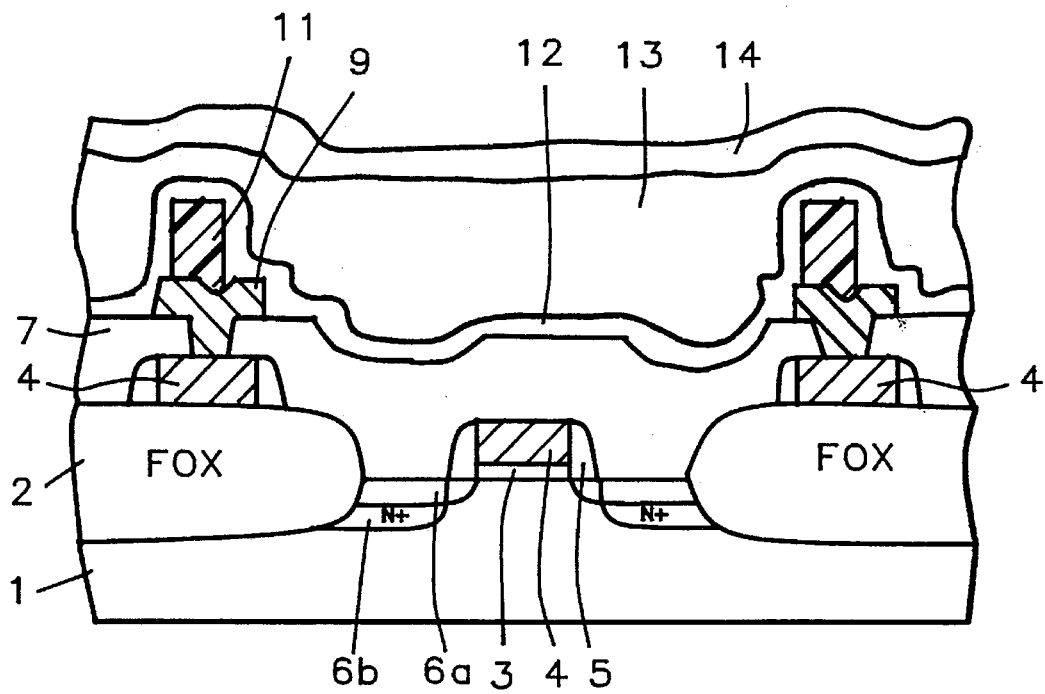
FIGS. 5–6, which schematically, in cross-sectional style, show the process stages used to create a planar topography.

FIG. 3, shows the application of another photosensitive resist layer, 10, at a thickness between about 6000 to 12000 Angstroms. A critical exposure is next performed for purposes of creating photoresist plug, 11, shown in FIG. 4. The photoresist plug, 11, is treated, using u.v. baking, to allow it to withstand subsequent high temperature processing, at temperatures about 450° C. The photolithographic mask used to create photoresist plug, 11, is the compliment of the photolithographic mask used in conventional via opening procedures. A first interlevel dielectric layer, 12, of silicon oxide, is deposited, using PECVD processing, at a temperature between about 200° to 450° C., to a thickness between about 500 to 3000 Angstroms. It is imperative that the temperature remain below about 450° C., to avoid degradation to photoresist plug, 11. The deposition characteristics of first interlevel dielectric layer do not result in complete filling of the spaces between photoresist plugs, and by itself can not produce a planar topography for subsequent overlying metallization levels. Therefore a layer of spin on glass, (SOG), 13, is applied, using conventional coating methods, to a thickness between about 3000 to 7000 Angstroms. The SOG layer, 13, is subjected to a bake out at a temperature between about 100° to 200° C., and curing, at a temperature between about 250° to 450° C., for purpose of removing incorporated, volatile components from the SOG layer. These process sequences, shown schematically in FIG. 5, indicate the successful filling of the spaces between photoresist plugs, 11. It is also important that the subsequent via metallization, interface first dielectric layer, 12, rather than interface the less dense SOG layer, 13.

Figure 6:
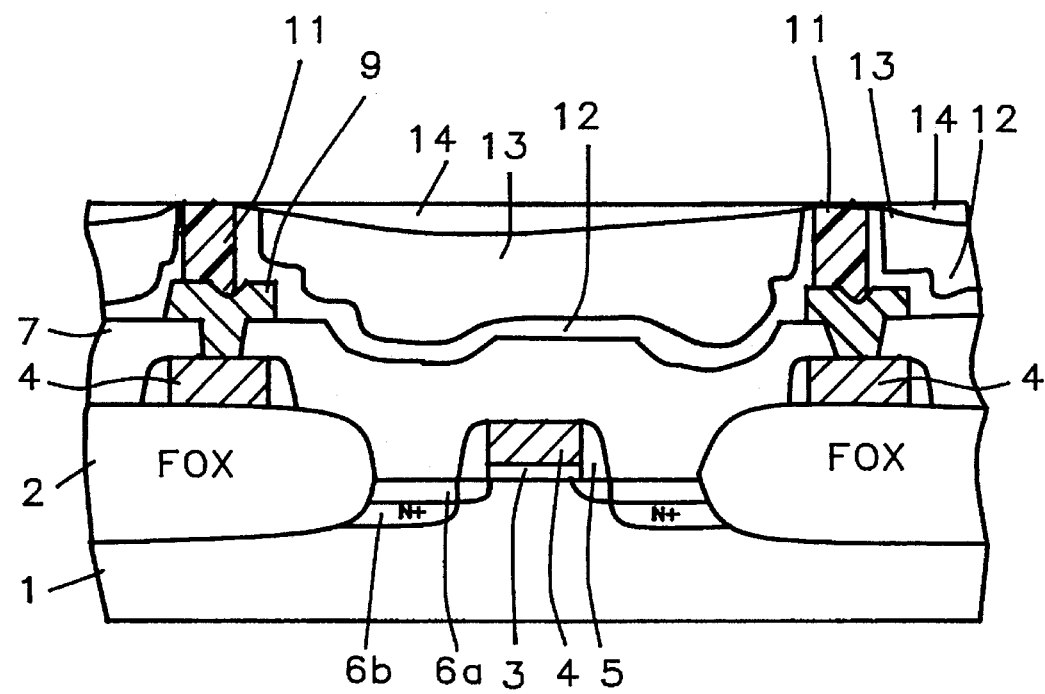
Figure 7:
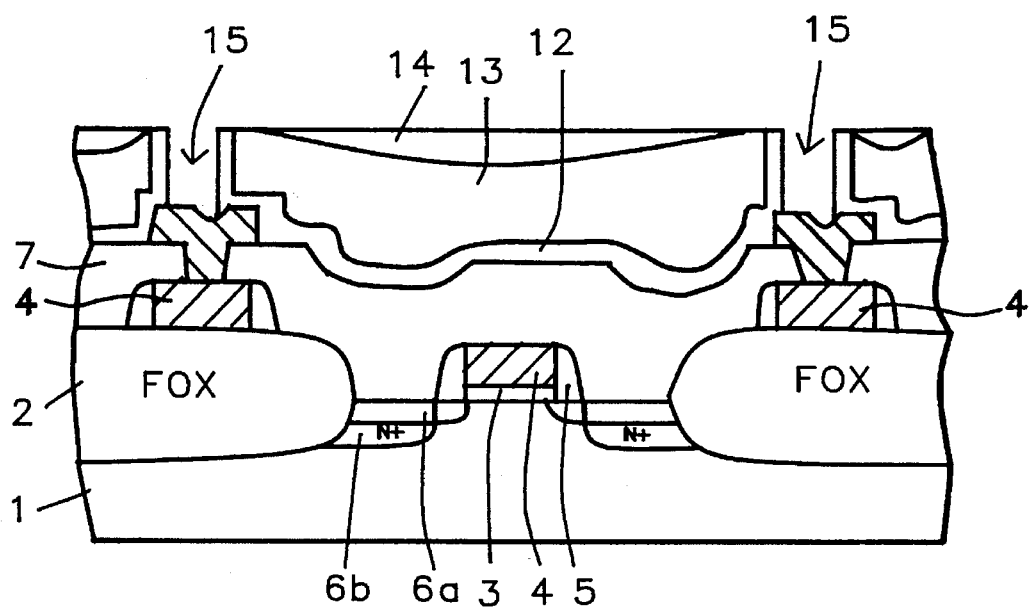
FIGS. 7–9, which schematically, in cross-sectional style, show the formation of an overlying metallization on a planar, underlying topography.

A second interlevel dielectric layer, 14, of silicon oxide, is now deposited using PECVD processing, at a temperature between about 200° to 450° C., to a thickness between about 6000 to 12000 Angstroms. A chemical mechanical polishing, (CMP), procedure is than used finalize the surface planarity, shown schematically in FIG. 6. The CMP process, using conventional methods, is performed to a point in which the top surface of photoresist plug, 11, is exposed. At this stage the photoresist plugs, 11, are removed using plasma oxygen ashing or wet chemical processing, followed by careful wet cleans, and a sputter clean, performed in a metal deposition tool, for purposes of removing native oxide from the surface of first level metal structure, 9. The removal of photoresist plug, 11, results in the formation of the second via hole, 15, shown in FIG. 7.

Figure 8:
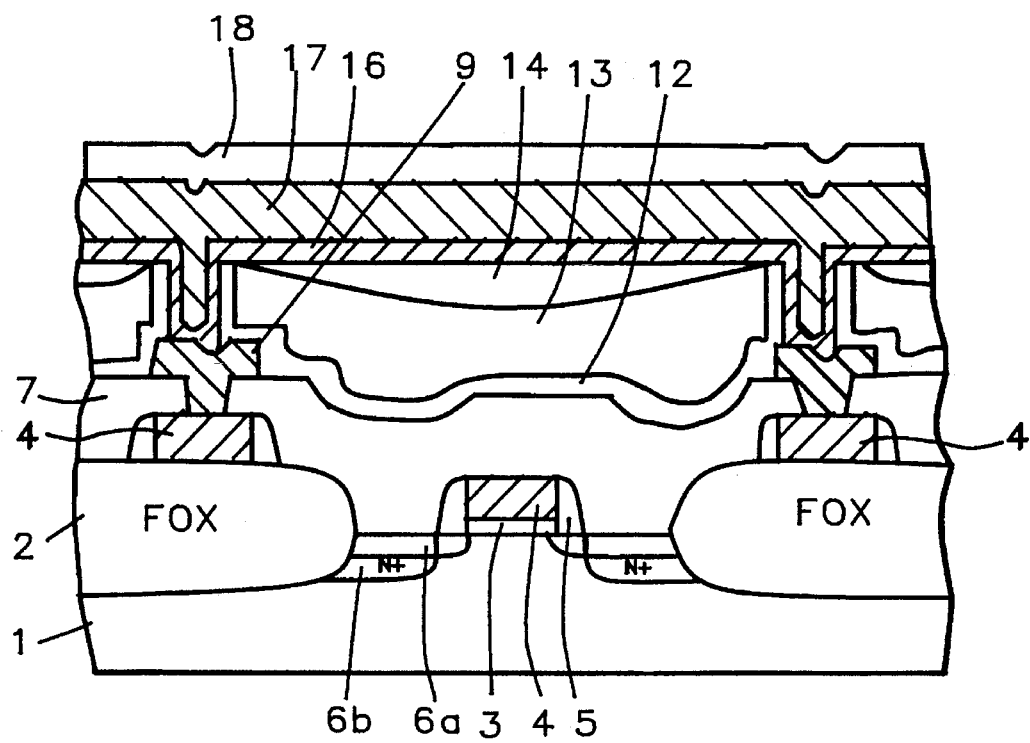

A contact and barrier metallization, 16, of titanium, at a thickness between about 300 to 1000 Angstroms, and titanium nitride, at a thickness between about 200 to 1000 Angstroms, is deposited and shown in FIG. 8. Next a deposition of an aluminum copper layer, 17, is performed using r.f. sputtering, at a temperature between about 22° to 550° C. The ability to perform the aluminum based metallization at elevated temperatures, results in the optimum metal characteristics, such as resistivity and conformality.

Figure 9:
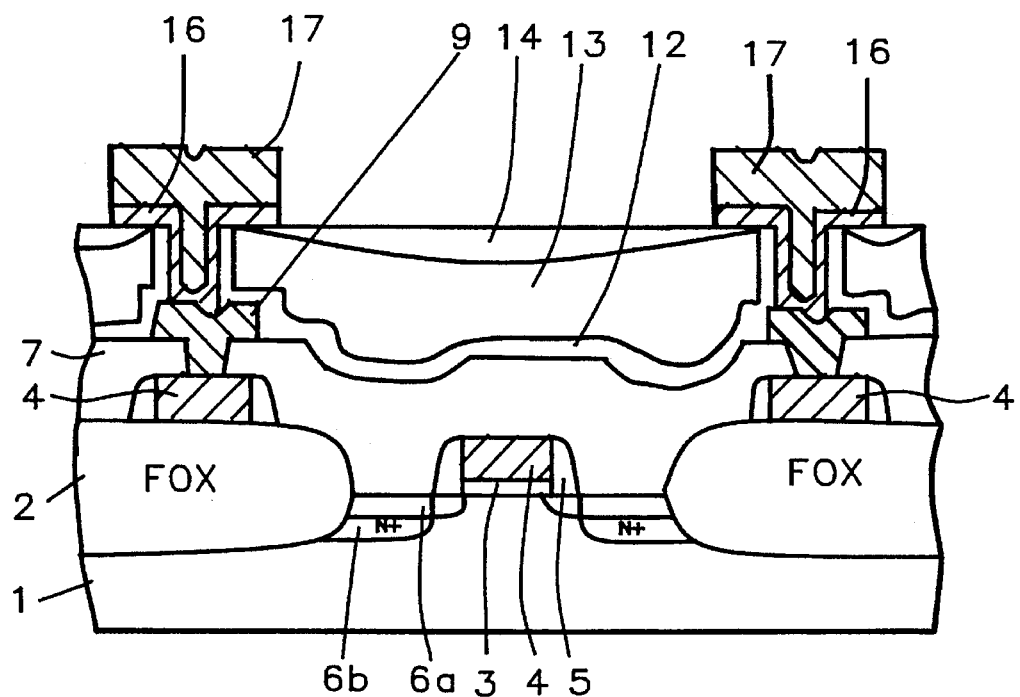

This was possible since no SOG layer was exposed at the sidewall of the via. If the SOG layer was exposed during the aluminum deposition, possible evolution of volatile components could have occurred, deleteriously influencing the properties of the aluminum metallurgy. In addition to the deposition of the contact and barrier layer, 16, and the aluminum based metallurgy layer, 17, a anti-reflective coating, (ARC), for example a layer of titanium nitride, 18, is also deposited using r.f. sputtering, to a thickness between about 5000 to 10000 Angstroms. The ARC layer will aid in allowing subsequent photolithographic exposures to be performed. Conventional photolithographic and RIE procedures, using for example, $Cl_2$ as an etchant, are performed to create the second level metal structure, consisting of titanium nitride, aluminum—copper, titanium nitride—titanium. Photoresist removal is again accomplished via plasma oxygen ashing and careful wet cleans. The resulting second level metal structure is shown schematically in FIG. 9.

This process of using a SOG layer to create planar topographies for subsequent metallization levels, although shown being applied to an N channel MOSFET device, can be applied to a P channel, (PFET), device, a complimentary, (CMOS), device, or a BiCMOS, (bipolar - CMOS), device.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device on a semiconductor substrate, using a spin on glass insulator, with metal filled via holes and metal interconnects, comprising the steps of:

providing the elements of said MOSFET device;

depositing a first insulator layer on said semiconductor substrate, including on said elements of said MOSFET device;

opening a first via hole in said first insulator layer, to expose a top surface of one of said elements of said MOSFET device;

depositing a first metallization layer, in said first via hole, including depositing on the exposed top surface, of said element of said MOSFET device, and on a surface of said first insulator layer;

patterning said first metallization layer to form a first level metal structure, and providing a contact to said element of said MOSFET device;

applying a photoresist layer covering said first level metal structure;

patterning a said photoresist layer to form photoresist plugs on a top surface of said first level metal structures;

heat treating said photoresist plugs;

depositing of a first interlevel dielectric layer on exposed surfaces of the photoresist plugs, as well as on exposed surfaces of said first level metal structure, and on said first insulator layer;

applying a spin on glass layer on said first interlevel dielectric layer, partially filling spaces between said photoresist plugs;

heat treating said spin on glass layer;

curing said spin on glass layer;

depositing of a second interlevel dielectric layer on said spin on glass layer, completely filling said spaces between said photoresist plugs;

chemical mechanical polishing to expose the top surface of said photoresist plugs, and smoothing a surface of exposed said first interlevel dielectric layer, a surface of exposed said spin on glass layer, and a surface of exposed said second interlevel dielectric layer, in spaces between said photoresist plugs;

removing said photoresist plugs, resulting in formation of a second via hole, in said first interlevel dielectric layer, exposing the top surface of said first level metal structure;

depositing a contact and barrier metallization in said second via hole, including on the exposed top surface of said first level metal structure, and on the exposed surface of said first interlevel dielectric layer, on the exposed surface of said spin on glass layer, and on the exposed surface of said second interlevel dielectric layer;

depositing a second metallization layer on said contact and barrier metallization;

depositing an anti-reflective coating on said second metallization layer; and patterning said second metallization layer, and said contact and barrier layer, to form a second level metal structure.

2. The method of claim 1, wherein said element, of said MOSFET device is a polysilicon gate structure.

3. The method of claim 1, wherein said first insulator layer is silicon oxide, deposited using either PECVD, LPCVD, or APCVD processing, at a temperature between about 400° to 700° C., to a thickness between about 5000 to 10000 Angstroms.

4. The method of claim 1, wherein said first metallization layer is aluminum with between about 0.5 to 4% copper, and between about 0.5 to 1% silicon, deposited using r.f. sputtering, to a thickness between about 6000 to 10000 Angstroms.

5. The method of claim 1, wherein said photoresist layer is applied to a thickness between about 6000 to 12000 Angstroms.

6. The method of claim 1, wherein said first interlevel dielectric layer is silicon oxide, deposited using PECVD processing, at a temperature between about 200° to 450° C., to a thickness between about 500 to 3000 Angstroms.

7. The method of claim 1, wherein said spin on glass layer is applied at a temperature between about 20° to 25° C., to a thickness between about 3000 to 7000 Angstroms.

8. The method of claim 1, wherein said spin on glass is heat treated at a temperature between about 100° to 200° C., for a time between about 10 to 50 min., using hot plates, and cured using conventional ovens, at a temperature between about 250° to 450° C.

9. The method of claim 1, wherein said second interlevel dielectric layer is silicon oxide, deposited using PECVD processing, at a temperature between about 200° to 450° C., to a thickness between about 6000 to 12000 Angstroms.

10. The method of claim 1, wherein said chemical mechanical polishing is performed using conventional methods.

11. The method of claim 1, wherein said photoresist plugs are removed using plasma oxygen ashing or wet chemical processes.

12. The method of claim 1, wherein said contact and barrier metallization is titanium, deposited using r.f. sputtering, to a thickness between about 300 to 1000 Angstroms, and titanium nitride, deposited using r.f. sputtering, to a thickness between about 200 to 1000 Angstroms.

13. The method of claim 1, wherein said second metallization layer is aluminum, with between about 0.5 to 4% copper, deposited using r.f. sputtering, at a temperature between about 22° to 550° C.

14. A method for fabricating a MOSFET device, on a semiconductor substrate, with a planarized surface, by using a spin on glass to fill spaces between metal filled via holes and metal interconnects, comprising the steps of:

providing a polysilicon gate structure, of a said MOSFET device;

depositing a first insulator layer of silicon oxide on said semiconductor substrate, including on said polysilicon gate structure;

opening a first via hole in said first insulator layer of silicon oxide to expose a top surface of said polysilicon gate structure, and source a and drain region;

depositing a first aluminum based metallization layer in said first via hole, including on the exposed top surface of said polysilicon gate structure, on the surface of said source and drain region, and on a surface of said first insulator layer of silicon oxide;

patterning said first aluminum based metallization layer to form a first level aluminum based metal structure;

applying photoresist layer, covering said first level aluminum based metal structure;

patterning said photoresist layer to form photoresist plugs on a top surface of said first level aluminum based metal structure;

baking said photoresist plugs;

depositing a first silicon oxide interlevel layer on exposed surfaces of said photoresist plugs, as well as on exposed surfaces of said first level aluminum based metal structure, and on said first insulator layer of silicon oxide;

applying a spin on glass layer on said first silicon oxide interlevel layer, partially filling spaces between said photoresist plugs;

heat treating said spin on glass layer;

curing said spin on glass layer;

depositing a second silicon oxide interlevel layer on said spin on glass layer, completely filling the spaces between said photoresist plugs;

chemical mechanical polishing to expose a top surface of said photoresist plugs, while planarizing a surface of exposed said first silicon oxide interlevel layer, a surface of exposed said spin on glass layer, and a surface of exposed said second silicon oxide layer, in spaces between said photoresist plugs;

said photoresist plugs, resulting in formation of a second via hole, in said first silicon oxide interlevel layer, exposing a top surface of said first aluminum based metal structure;

a titanium—titanium nitride layer in said second via hole, including on the exposed top surface of said first aluminum based metal structure, and on the exposed surface of said first silicon oxide interlevel layer, on the exposed surface of said spin on glass layer, and on the exposed surface of said second silicon oxide interlevel layer said titanium—titanium nitride layer forming a titanium contact metallization and a titanium nitride barrier metallization;

depositing a second aluminum based metallization layer on said titanium—titanium nitride layer;

depositing an anti-reflective coating on said second aluminum based metallization layer; and patterning said second aluminum based metallization layer, and said titanium—titanium nitride layer, to form a second level aluminum based metal structure.

15. The method of claim 14, wherein said first insulator layer of silicon oxide is deposited using either PECVD, LPCVD, or APCVD processing, at a temperature between about 400° to 700° C., to a thickness between about 5000 to 10000 Angstroms.

16. The method of claim 14, wherein said first aluminum based metallization layer is deposited using r.f. sputtering, to a thickness between about 6000 to 10000 Angstroms, containing between about 0.5 to 4% copper, and between about 0.5 to 1% silicon.

17. The method of claim 14, wherein said photoresist layer is applied to a thickness between about 6000 to 12000 Angstroms.

18. The method of claim 14, wherein said first silicon oxide interlevel layer is deposited using PECVD processing, at a temperature between about 200° to 450° C., to a thickness between about 500 to 3000 Angstroms.

19. The method of claim 14, wherein said spin on glass layer is applied at a temperature between about 20° to 25° C., to a thickness between 3000 to 7000 Angstroms.

20. The method of claim 14, wherein said spin on glass layer is heat treated at a temperature between 100° to 200° C., for a time between about 10 to 50 mins., using hot plates, and cured using conventional oven processing, at a temperature between about 250° to 450° C.

21. The method of claim 14, wherein said second silicon oxide interlevel layer is deposited using PECVD processing, at a temperature between about 200° to 450° C., to a thickness between about 6000 to 12000 Angstroms.

22. The method of claim 14, wherein said chemical mechanical polishing is performed using conventional methods.

23. The method of claim 14, wherein said photoresist plugs are removed using plasma oxygen ashing or wet chemical processes.

24. The method of claim 14, wherein said titanium contact metallization is deposited using r.f. sputtering, to a thickness between about 300 to 1000 Angstroms, while said titanium nitride barrier metallization is deposited using r.f. sputtering, to a thickness between about 200 to 1000 Angstroms.

25. The method of claim 14, wherein said second aluminum based metallization is deposited using r.f. sputtering, to a thickness between about 5000 to 10000 Angstroms, containing between about 0.5 to 4% copper.

* * * * *

UNITED STATES PATENT AND TRADEMARK OFFICE
CERTIFICATE OF CORRECTION

PATENT NO. : 5,616,519
DATED : April 1, 1997
INVENTOR(S) : Jennifer Su Ping Teong It is certified that error appears in the above-indentified patent and that said Letters Patent is hereby corrected as shown below:

On the title page, item [19] should read -- Su Ping Teong --
item [75] " Teong Su Ping" should read
-- Su Ping Teong --.

Signed and Sealed this

Eighth Day of December, 1998

Attest:

BRUCE LEHMAN

*Attesting Officer*  Commissioner of Patents and Trademarks